(12) United States Patent
Kuhwald et al.

(10) Patent No.: US 9,136,812 B2
(45) Date of Patent: Sep. 15, 2015

(54) DEVICES FOR AUTOMATIC ADJUSTMENT OF GAIN AND ATTENUATION FACTORS

(75) Inventors: Thomas Kuhwald, Markt Schwaben (DE); Thomas Valten, Unterhaching (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 39 days.

(21) Appl. No.: 14/003,796

(22) PCT Filed: Mar. 15, 2012

(86) PCT No.: PCT/EP2012/054576
§ 371 (c)(1),
(2), (4) Date: Sep. 7, 2013

(87) PCT Pub. No.: WO2012/130625
PCT Pub. Date: Oct. 4, 2012

(65) Prior Publication Data
US 2014/0030993 A1    Jan. 30, 2014

(30) Foreign Application Priority Data
Mar. 31, 2011   (DE) .......................... 10 2011 006 566

(51) Int. Cl.
*H04B 1/06*   (2006.01)
*H04B 7/00*   (2006.01)
(Continued)

(52) U.S. Cl.
CPC ............... *H03G 3/20* (2013.01); *H03G 3/3052* (2013.01)

(58) Field of Classification Search
CPC ..... H03G 3/20; H03G 3/3052; H03G 1/0023; H03G 3/001; H03G 3/3036; H03G 9/00; H04B 1/30; H04B 1/06; H03F 3/195; H03F 3/45085; H03F 3/45475; H03F 3/602; H03F 3/68; H03F 3/07; H04M 7/00
See application file for complete search history.

(56) References Cited

U.S. PATENT DOCUMENTS

| 4,456,889 A | 6/1984 | Kumar |
| 4,851,842 A | 7/1989 | Iwamatsu |
| 6,037,999 A * | 3/2000 | Kunishima .................... 348/731 |

(Continued)

FOREIGN PATENT DOCUMENTS

| DE | 102006005032 A1 | 8/2007 |
| EP | 0410629 A2 | 1/1991 |

(Continued)

OTHER PUBLICATIONS

PCT/EP2012/054576 International Preliminary Report on Patentability (English Translation), Oct. 10, 2013.

*Primary Examiner* — Pablo Tran
(74) *Attorney, Agent, or Firm* — Potomac Technology Law, LLC

(57) ABSTRACT

A device for the automatic adjustment of a gain and/or attenuation factor of several amplification or attenuation elements connected in a cascade comprises respectively a detector for measuring a signal level of a signal disposed at the input of the respective amplification or attenuation element and respectively a downstream control unit for determining the gain and/or attenuation factor respectively associated with each amplification or attenuation element. The control unit is a forward control unit for determining the gain and/or attenuation factor respectively associated with each amplification or attenuation element dependent upon the measured signal level of the signal disposed at the input of each amplification or attenuation element.

7 Claims, 5 Drawing Sheets

(51) Int. Cl.
*H03G 3/20* (2006.01)
*H03G 3/30* (2006.01)

(56) References Cited

U.S. PATENT DOCUMENTS

| | | | |
|---|---|---|---|
| 6,070,058 A | 5/2000 | Waldroup et al. | |
| 6,744,882 B1 * | 6/2004 | Gupta et al. | 379/387.01 |
| 6,763,228 B2 * | 7/2004 | Prentice et al. | 455/127.2 |
| 6,977,976 B1 | 12/2005 | Birkett et al. | |
| 7,227,916 B2 * | 6/2007 | Ruelke et al. | 375/345 |
| 7,492,294 B2 | 2/2009 | Rueckriem | |
| 7,893,761 B2 * | 2/2011 | Fulga | 330/124 R |
| 8,521,114 B2 * | 8/2013 | Carugati | 455/234.1 |
| 2009/0239491 A1 * | 9/2009 | Bargroff et al. | 455/234.1 |

FOREIGN PATENT DOCUMENTS

| | | |
|---|---|---|
| GB | 2179810 A | 3/1987 |
| JP | 2004080455 A | 3/2004 |
| WO | WO0059110 A2 | 10/2000 |

* cited by examiner

DEVICES FOR AUTOMATIC ADJUSTMENT OF GAIN AND ATTENUATION FACTORS

CROSS-REFERENCE TO RELATED APPLICATION(S)

The present application is a national phase application of PCT application No. PCT/EP2012/054576, filed Mar. 15, 2012, and claims priority to German Patent Application No. DE 102011006566.0, filed Mar. 31, 2011, the entire contents of which are incorporated herein by reference.

FIELD

Embodiments of the present invention relate to devices for the automatic adjustment of gain and attenuation factors of cascaded amplification and attenuation elements.

BACKGROUND

The input unit of modern radio devices typically provides a very high input dynamic in order to receive radio signals over the widest possible radio range. This input dynamic of an input unit generally exceeds the dynamic range of signal processing units in radio devices, such as, filters or analog/digital converters. However, to achieve a high dynamic, automatic gain control circuits (automatic gain control, AGC) are used.

A signal-processing path with several cascaded amplifiers adjustable with regard to their gain factor, the gain factor being adjusted in each case by a control circuit based on a feedback structure (feed-back-structure), is known from JP 2004-080455 A.

An automatic gain control of this kind is only conditionally suitable for amplifiers arranged in the signal path of a radio device, because a feedback control structure is generally associated with poor settling behaviour and therefore provides a poorer time dynamic, and because modern radio devices are operated in a frequency-hop method with comparatively short time slots for message transmission. Moreover, the control structure can tend, dependent upon its structure, towards unstable behaviour, which is not acceptable for secure message transmission, for example, in aeronautical radio technology.

Accordingly, there is a need for a device with automatic gain and/or attenuation control for amplification and/or attenuation elements disposed in the signal path of a radio device, which provides optimal time behaviour.

SUMMARY

Embodiments of the present invention, therefore, advantageously provide for a device for automatic adjustment of the gain and/or attenuation factor of several amplification and/or attenuation elements connected in a cascade.

According to an example embodiment of the present invention, the device for the automatic adjustment of the gain and/or attenuation factor of several amplification and/or attenuation elements connected in a cascade provides, for each amplification and/or attenuation element, a detector for measuring the signal level at the input of the respective amplification and/or attenuation element, and a downstream control unit for determining the gain and/or attenuation factor associated with each amplification and/or attenuation element. By way of example, each control unit is realised as a forward control unit, which determines the gain and/or attenuation factor respectively associated with each amplification and/or attenuation element dependent upon the measured signal level of the signal disposed at the output of the respective amplification and/or attenuation element. The transmission characteristic of the control unit associated with the amplification element can be determined from the transmission characteristic of the associated detector and the transmission characteristic of the associated amplification element.

According to an example embodiment of a control unit associated with the amplification element, the control unit includes a buffer, of which the memory cells are each addressable dependent upon the abscissa value of the transmission characteristic of the control unit, that is to say, dependent upon the signal level from the detector disposed at the input of the respective amplification element and imaging in a linear scale, and of which the addressable memory-cell content, that is, the associated gain factor, can be read out at the output of the control unit.

According to a further example embodiment of a control unit associated with the amplification element, the control unit includes a multiplier for weighting the signal level measured by the detector at the input of the respective amplification element with a weighting factor which corresponds to the gradient of the transmission characteristic associated with the control unit, and the control unit includes an adder for adding a signal level weighted in this manner with an offset value (offset value) which corresponds to the ordinate-axis value of the transmission characteristic associated with the respective control unit.

The transmission characteristic of the control unit associated with an attenuation element can be determined from the transmission characteristic of the associated detector, which converts a signal level of the signal disposed at the input of the respective attenuation element registered in the logarithmic scale into a signal present in the linear scale disposed at the output of the detector, and the individual attenuation factors to be adjusted in the attenuation elements. For this purpose, the control unit associated with the attenuation element comprises an automatic state unit, which, in each case, provides one state for each attenuation factor realisable in the attenuation element. The automatic state unit waits in the respective state for as long as the signal disposed at the output of the detector is disposed within a signal-level range associated with that state. If the signal level present at the output of the detector leaves the signal-level range associated with the respective state, a switchover into one of the two adjacent states is implemented. The transitions between the individual states of the automatic state unit are implemented by means of a hysteresis characteristic.

BRIEF DESCRIPTION OF THE DRAWINGS

Embodiments of the present invention for the automatic adjustment of the gain and/or attenuation factor of cascaded amplification and/or attenuation elements are illustrated by way of example, and not by way of limitation, in the figures of the accompanying drawings and in which like reference numerals refer to similar elements and in which.

DETAILED DESCRIPTION

A device for automatic adjustment of the gain and/or attenuation factor of several amplification and/or attenuation elements connected in a cascade, is described.

Figure 1:
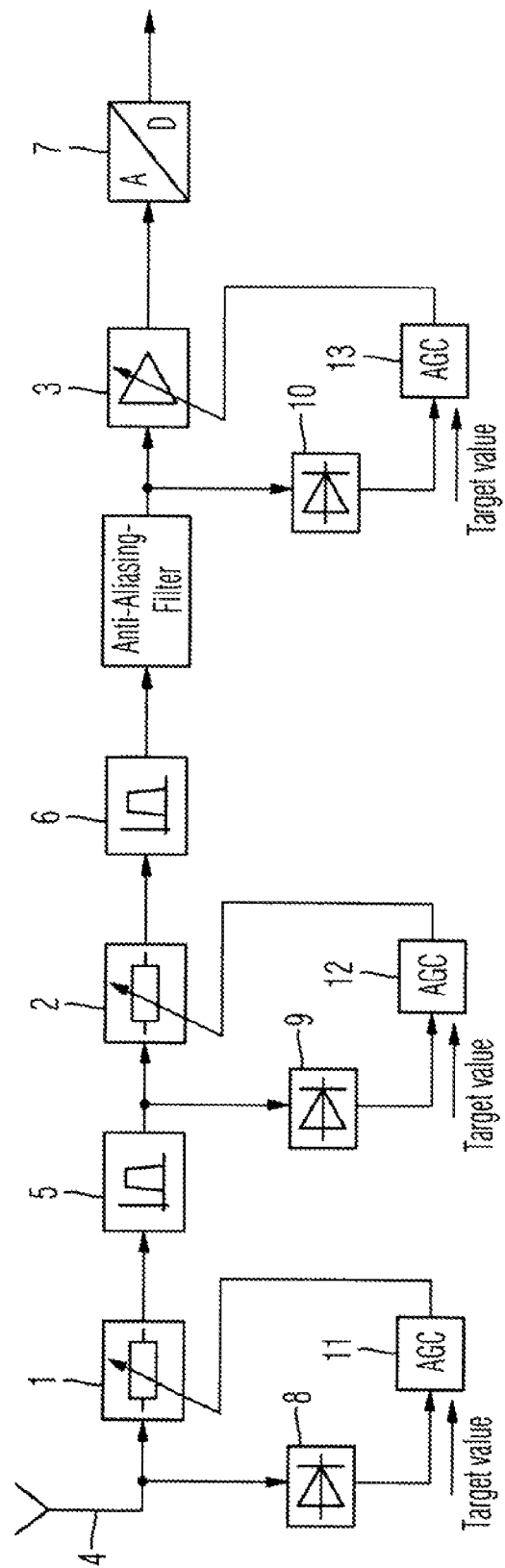
FIG. 1 shows a block-circuit diagram of a receiver-end signal path of a radio device, in which a device in accordance with example embodiments of the invention is used.

Switchable attenuation elements 1 and 2 and/or adjustable amplifiers 3, which ensure that the signal from the radio signal received from an antenna can be processed in the radio device within the existing dynamic range of the individual signal-processing units, comprising, for example, the high-frequency selection filter 5, the intermediate-frequency selection filter 6, the analog/digital converter 7, are inserted in the signal path of a radio device from the antenna to the analog/digital converter, as shown in FIG. 1. The adjustment of the gain and/or attenuation factor of the individual amplification and/or attenuation units 1, 2 and 3 is implemented after a measurement of the signal level at the input of the respective amplification and/or attenuation unit 1, 2 and 3 by means of an associated detector 8, 9 and 10 in an associated automatic gain control (Automatic Gain Control (AGC)) 11, 12 and 13.

Figure 3A:
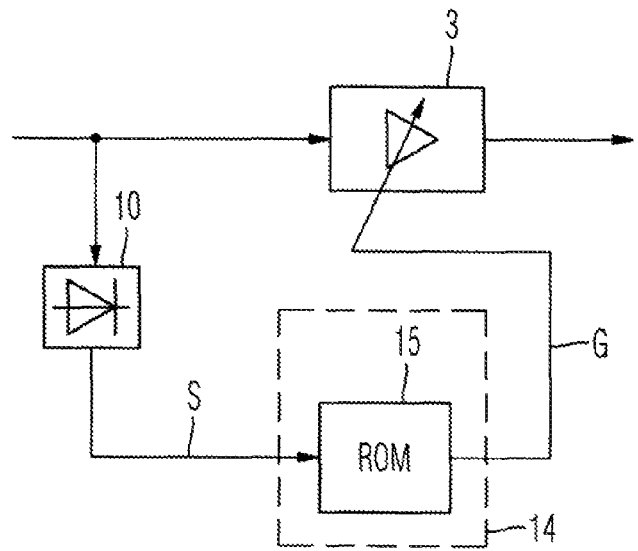
FIGS. 3A, 3B show respective block-circuit diagrams of a control unit according to example embodiments of the invention associated with an amplification element.

In a first embodiment according to FIG. 3A, the control unit 14 according to the invention for determining a gain factor for an amplification element 3, that is to say, for an amplifier adjustable with regard to its gain factor G, comprises a buffer 15, which is embodied as a read-only memory (Read Only Memory (ROM)). The values of the gain factor G for the amplification element 13 embodied in an equidistant matrix are stored in the individual memory cells of the buffer 15. The individual memory cells of the buffer 15 are addressable dependent upon the signal level of the signal disposed at the output of the detector 10. In this manner, the first embodiment of the control unit 14 according to the invention realised by the buffer 15 provides a transmission characteristic between the signal level of the signal S present in the linear scale at the output of the detector 10 and the gain factor G adjusted in the amplification element 3 in the logarithmic scale, as shown in FIG. 6A.

Figures 3B, 4:
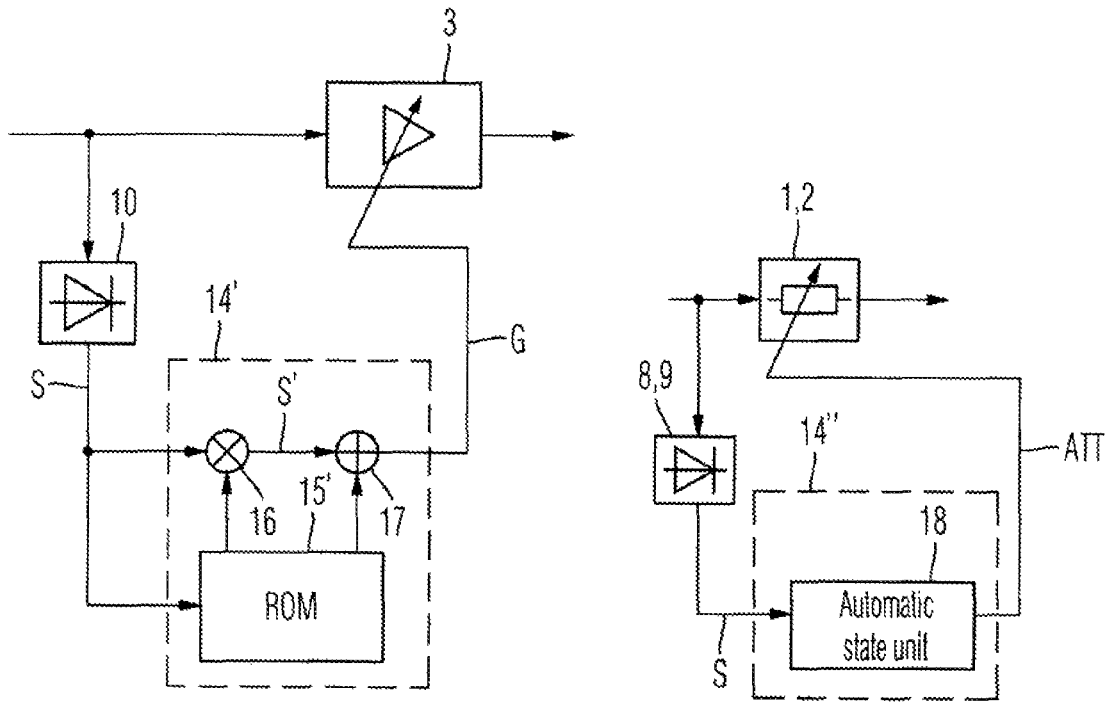
FIG. 4 shows a block-circuit diagram of a control unit according to an example embodiment of the invention associated with an attenuation element.

The control unit 14' according to the invention for determining a gain factor G for an amplification element 3, as shown in FIG. 3B, comprises a series circuit of a multiplier 16 (e.g., a digital multiplier) and an adder 17 (e.g., a digital adder). In the multiplier 16, the signal S present in the linear scale at the output of the detector 10 is weighted with a weighting factor stored in a buffer 15', for example a ROM memory, which corresponds to the gradient of the transmission characteristic of the control unit 14 and/or 14', as shown in FIG. 6A. The signal S' weighted with the weighting factor is added in the adjacent adder 17 to an offset value (offset value) stored in the buffer 15', which corresponds to the ordinate-axis value of the transmission characteristic of the control unit 14 and/or 14', as shown in FIG. 6A. The memory cells of the buffer 15' storing the respective weighting-factor and offset value are addressed via the signal level of the signal disposed at the output of the detector 10. Accordingly, with the second embodiment of a control unit 14' according to the invention, a transmission characteristic is realised between the signal level of the signal S present in the linear scale at the output of the detector 10 and the gain factor G adjusted in the logarithmic scale in the amplification element 3, as shown in FIG. 6A.

Figure 2A:
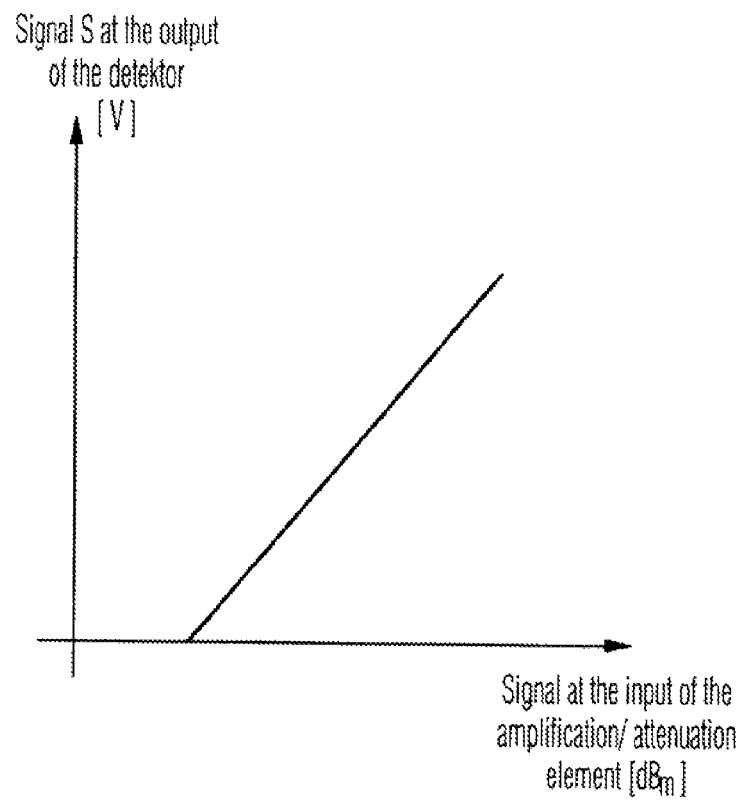
FIGS. 2A, 2B show diagrams illustrating respective examples of the transmission characteristic of a detector and the transmission characteristic of an amplification element.
Figure 2B:
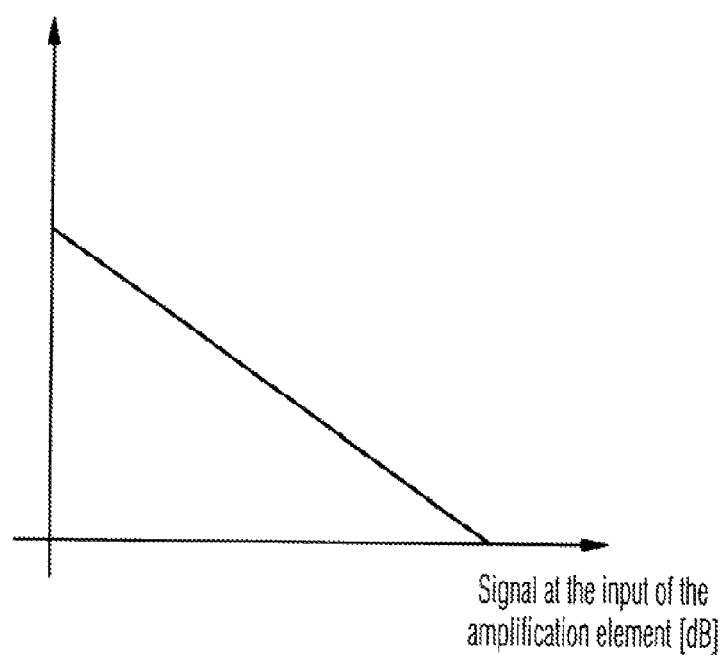
Figure 6A:
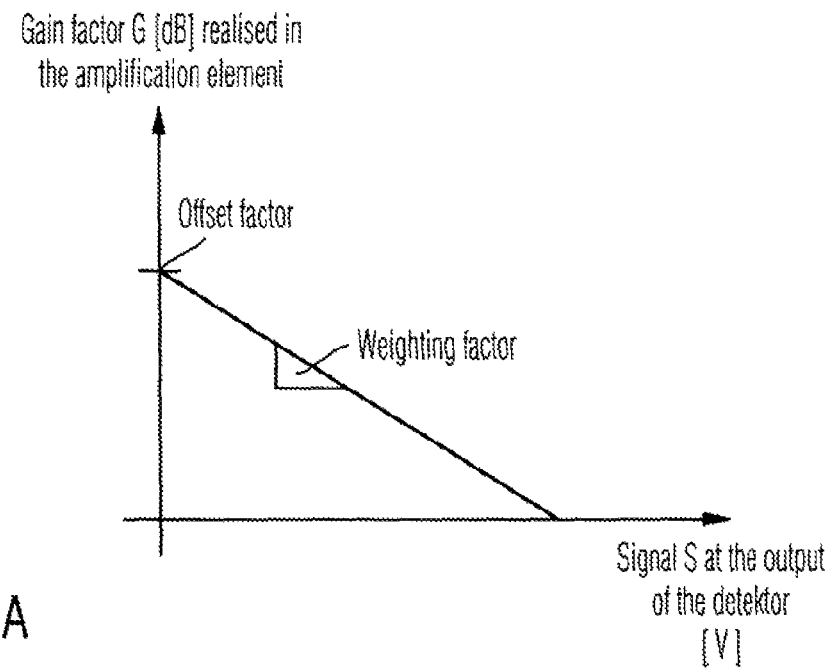
FIGS. 6A, 6B show respective diagrams illustrating the transmission characteristic of a control unit associated with the amplification element and a control unit associated with the attenuation element, in accordance with example embodiments of the present invention.

The gain-factor values stored for the first embodiment of a control unit 14 according to the invention in the memory cells of the buffer 15 and also the weighting factors and offset values stored for the second embodiment of a control unit 14' according to the invention in the memory cells of the buffer 15' are determined, in each case, in advance by measuring the transmission characteristic of the detector 10 between the signal measured at the input of the amplification element 3 in the logarithmic scale and the signal level of the signal present in the linear scale disposed at the output of the detector 10, as shown in FIG. 2A, and the transmission characteristic of the amplification element 3 between the signal level of the signal disposed at the input of the amplification element 3 measured in the logarithmic scale and the gain factor G adjusted in the amplification element 3 in the logarithmic scale, as shown in FIG. 6A.

Figure 5:
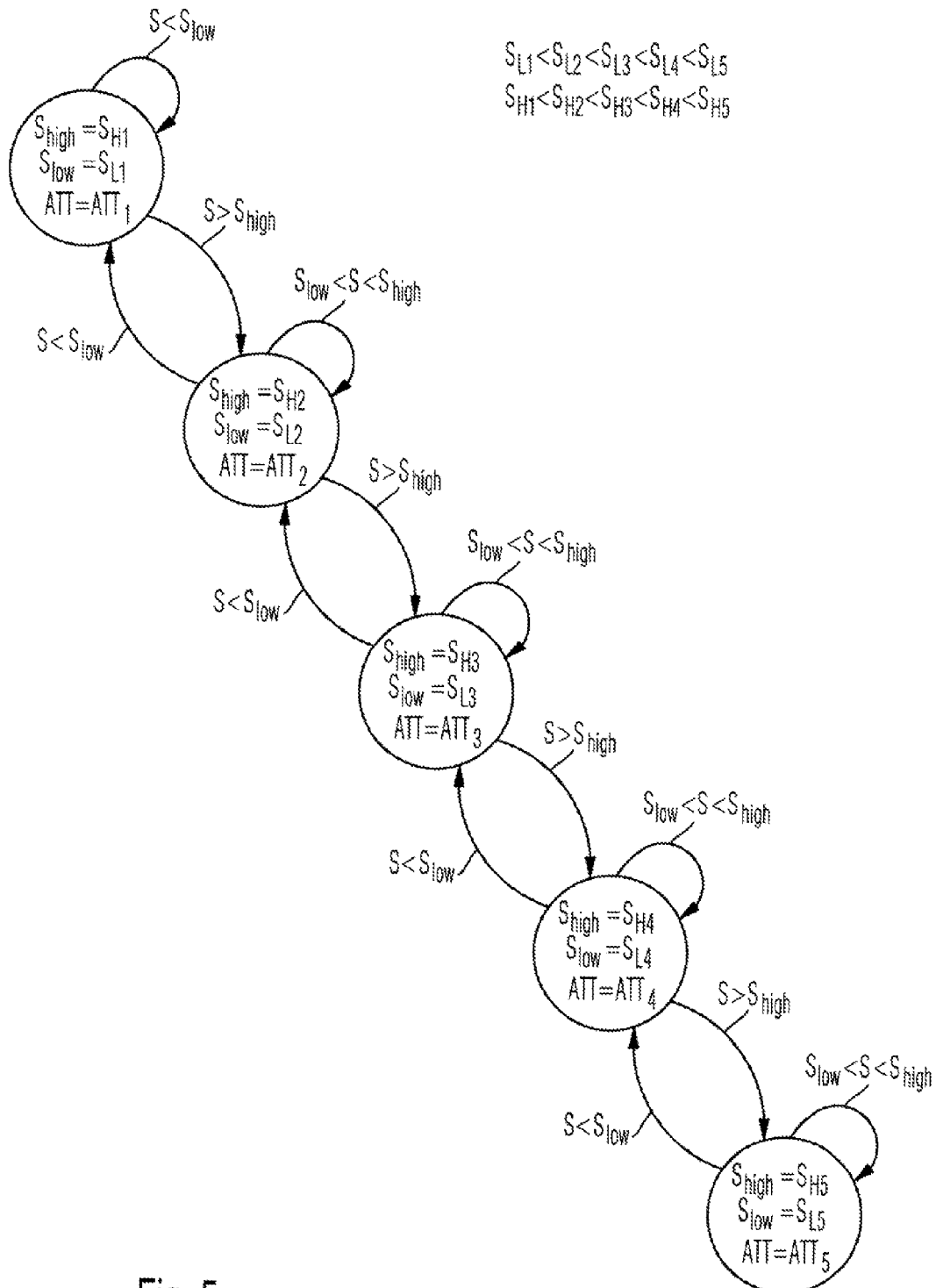
FIG. 5 shows a state diagram for determining an attenuation factor for an attenuation element in a control unit associated with an attenuation element, in accordance with example embodiments of the present invention.

The control unit 14" according to the invention for determining an attenuation factor ATT for an attenuation element 1 and/or 2 comprises an automatic state unit 18, as shown in FIG. 4. The automatic state unit 18 provides a number of states corresponding to the number of attenuation-factor values realised in the attenuation element 1 and/or 2. For example, the automatic state unit associated with the state diagram in FIG. 5 provides 5 states with the respectively associated attenuation-factor values ($ATT_1$, $ATT_2$, $ATT_3$, $ATT_4$, $ATT_5$). A larger number of states in the automatic state unit 18 can also be realised in order to achieve a finer screening of the attenuation factors adjustable in each case in the attenuation element 1 and/or 2.

The selection of the respective state of the automatic state unit 18 is implemented on the basis of the signal level of the signal S disposed at the output of the detector 8 and/or 9. For this purpose, a signal level range of the signal disposed at the output of the detector 8 and/or 9 is allocated to each individual state, as shown in FIG. 5. If the signal level of the signal S disposed at the output of the detector 8 and/or 9 rises above the signal-level range for the current state, a transition to the adjacent state, of which the signal-level range is disposed above the signal-level range of the current state, takes place in the automatic state unit 18. If the signal level of the signal S disposed at the output of the detector 8 and/or 9 falls below the signal-level range of the current state, the automatic state unit 18 moves to the adjacent state, of which the signal-level range is disposed below the signal-level range of the current state.

In order to avoid a constant switching of the automatic state unit 18 between two adjacent states in the case of a noise-affected signal level of the signal S disposed at the output of the detector 8 and/or 9 within the signal-level range of a state transition, the transitions between the individual states of the automatic state unit 18 provide a hysteresis characteristic, as illustrated in the state diagram in FIG. 5.

Figure 6B:
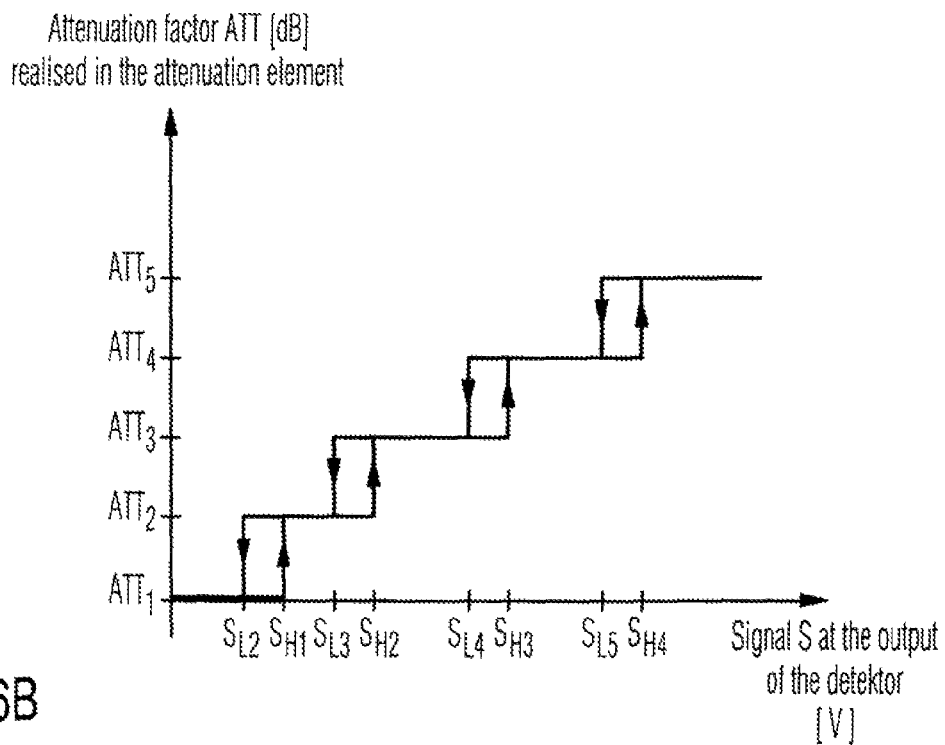

In this manner, with the control unit 14" according to the invention, a transmission characteristic is determined between the signal level of the signal S present in the linear scale at the output of the detector 8 and/or 9 and the attenuation factor ATT adjusted in the attenuation element 1 and/or 2 according to FIG. 6B.

The invention is not restricted to the embodiment illustrated. In particular, any combinations of the features illustrated in the drawings, described in the description and claimed in the claims are also covered by the invention.

The invention claimed is:

1. A device, comprising:
one or more of at least one amplification element and at least one attenuation element connected in a cascaded manner;
a detector respectively associated with each of the one or more of the at least one amplification element and the at least one attenuation element, configured to measure a signal level of a signal at an input of the respective amplification or attenuation element; and
a control unit respectively associated with each of the one or more of at the least one amplification element and the at least one attenuation element, each configured to determine a gain or attenuation factor for the respective amplification or attenuation element;
wherein each control unit comprises a multiplier and an adder disposed in series with the multiplier, wherein the multiplier and the adder are configured to apply a weighting factor and an offset value, respectively, to the measured signal level of the signal at the input of the respective amplification or attenuation element, and
wherein the weighting factor and the offset value applied to the measured signal level of the signal at the input of the respective amplification or attenuation element are stored in a buffer, and are addressed within the buffer based on the signal level measured by the respective detector.

2. The device according to claim 1, wherein a transmission characteristic of each control unit associated with an amplification element is determined based on a transmission characteristic of the respective detector between the measured signal level of the signal at the input of the respective amplification element and a signal level output at an output of the respective detector, and a transmission characteristic of the respective amplification element between the measured signal level of the signal at the input of the respective amplification element and the gain factor adjusted in the amplification element.

3. The device according to claim 2, wherein each control unit associated with an amplification element comprises a buffer, wherein the buffer is addressable based on abscissa values of the transmission characteristic of the control unit, and the buffer is configured to store associated ordinate values of the transmission characteristic of the control unit.

4. The device according to claim 2, wherein each control unit is associated with an amplification element, and wherein weighting factor corresponds to a gradient of the transmission characteristic associated with the control unit, and the offset value corresponds to an ordinate-axis value of the transmission characteristic associated with the control unit.

5. The device according to claim 2, wherein a transmission characteristic of each control unit associated with an attenuation element is determined based on a transmission characteristic of the respective detector between the measured signal level of the signal at the input of the respective attenuation element, a signal level output at an output of the respective detector and individual attenuation factors realizable by the attenuation element.

6. The device according to claim 5, wherein each control unit associated with an attenuation element is configured as an automatic state unit, wherein a respective state, in which the automatic state unit waits for an associated range of the signal level output at the output of the respective detector, is provided for each attenuation factor realizable by the attenuation element.

7. The device according to claim 6, wherein transitions between the states of the automatic state unit provide a hysteresis characteristic.

* * * * *